AUTOMATIC FREQUENCY CONTROL

Filed April 22, 1954

INVENTORS
ARNAUD CRAMWINCKEL
HENDRIK DE LANGE

BY Fred M Vogel

AGENT

United States Patent Office 2,851,602
Patented Sept. 9, 1958

2,851,602

AUTOMATIC FREQUENCY CONTROL

Arnaud Cramwinckel and Hendrik De Lange, Hilversum, Netherlands, assignors, by mesne assignments, to North American Philips Company, Inc., New York, N. Y., a corporation of Delaware Application April 22, 1954, Serial No. 424,946

Claims priority, application Netherlands April 29, 1953

4 Claims. (Cl. 250—36)

This invention relates to devices for automatic frequency correction (AFC) of an oscillator with respect to a control voltage such, for example, as stabilising pulses.

For automatic frequency correction of an oscillator with respect to a control voltage devices are known in which a frequency corrector controlled by an AFC-voltage is coupled to the oscillator, the AFC-voltage being derived from a control voltage generator comprising successively a mixing stage controlled by the control and oscillator voltages, a tuned high-frequency amplifier for selective amplification of oscillations derived from the mixing stage, and a detector from the output of which the AFC-voltage is derived by way of a low-pass filter.

In control devices of the kind described instability phenomena, for example the so-called "singing-round," are of frequent occurrence as a result of phase-shifts in the controll circuit.

The object of the invention is to mitigate or avoid such instability phenomena in the said control circuits, which phenomena are an obstacle for favourable proportioning and the use of a high control sensitivity.

According to the invention, for this purpose in control devices mentioned in the preamble the high-frequency amplifier comprises means for compensating, at least in part, for the retardation of alternating-voltage components of the detected AFC-voltage brought about by a sloped phase-versus-frequency characteristic of one or more tuning circuits of the high-frequency amplifier.

In order that the invention may be readily carried into effect, it will now be described with reference to the accompanying drawing, given by way of example, in which Fig. 1 shows a device according to the invention for automatic frequency correction of a high-frequency oscillator with respect to a control voltage composed of stabilising pulses.

Figure 1:
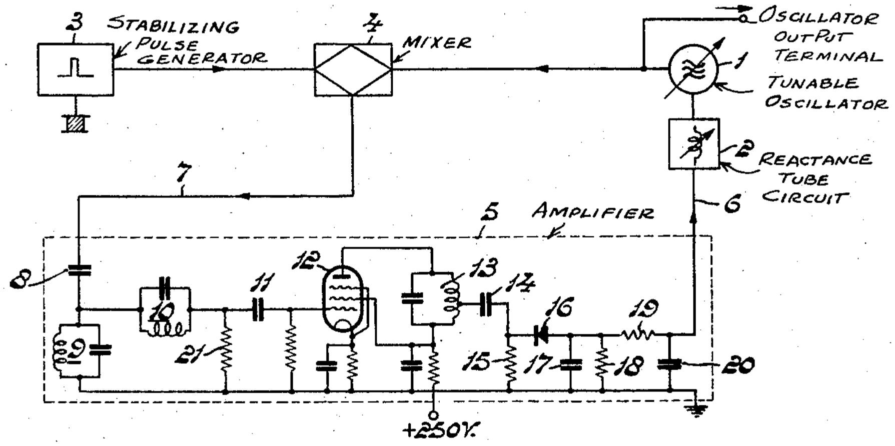

Referring now to Fig. 1, reference numeral 1 indicates a high-frequency oscillator which is tunable in a range of for example, from 10 to 20 mc./s. and which is coupled to a reactance tube circuit 2 which is to be controlled by an AFC-voltage. The tuning frequency of the high-frequency oscillator 1 is to be stabilised with the use of reactance tube circuit 2 on a high harmonic of stabilising pulses which may be chosen by initial tuning of the high-frequency oscillator. The stabilising pulses are generated by means of a crystal-controlled stabilising-pulse generator 3. In order to obtain the AFC-voltage which is to be supplied to reactance tube circuit 2, the sinusoidal output voltage of the high-frequency oscillator 1 and the output pulses of stabilising-pulse generator 3 are supplied to a mixing stage 4 which, normally, is cut off and which is released only during each stabilising pulse. The output circuit of mixing stage 4 comprises a high-frequency amplifier which is tuned to, for example, the third harmonic of the pulse-repetition frequency, hence to 600 kc./s. if the pulse repetition frequency is 200 kc./s., with subsequent amplitude detector and a low-pass filter as shown in detail in the amplifier stage 5 of the control-voltage generator which is surrounded by dotted lines. The output voltage of the amplifier stage 5 is the required AFC-voltage and is supplied, by way of a lead 6, to the reactance tube circuit 2.

The input circuit of the amplifier stage 5 is coupled by way of a connecting lead 7 to the output of mixing stage 4 and comprises a coupling capacitor 8 and a parallel circuit 9 which is tuned to the third harmonic of the stabilising pulses. The voltage set up across circuit 9 is supplied by way of compensating circuit 10, which will be described hereinafter, and a coupling capacitor 11 to the control grid of a pentode amplifier comprising a tuned output circuit 13. The amplified voltage is derived from a tapping on the coil of circuit 13 and supplied by way of a coupling capacitor 14 to an amplitude detector comprising an input resistor 15 and a rectifying cell 16. The output circuit of the said detector comprises the parallel combination of a capacitor 17 and a resistor 18, the detected voltage set up across it being supplied by way of a smoothing filter having a series-resistor 19 and a parallel capacitor 20 to the reactance tube circuit 2.

In the embodiment shown, the AFC-loop circuit, starting from the high-frequency oscillator 1, includes the control-voltage generator comprising mixing stage 4 and the amplifier stage 5, and the reactance tube circuit 2. Oscillations readily occur in such a loop circuit, as soon as the gain factor going around through the loop system is greater than 1 for alternating voltages supplied to the reactance tube, having a frequency of, for example, some kcs./s. and the total phase-shifts then occurring are about 180°. In this connection it is to be noted that in control devices of the kind described it is necessary for avoiding such oscillations that the phase-shifts occurring in amplifiers and filters of the loop circuit should be smaller than 90°. Such alternating voltages then occur in the high-frequency amplifier 9—15 of the control-voltage generator as modulations of the high-frequency oscillations to be amplified and are supplied by way of detector 15, 16 and the smoothing filter back to the reactance tube circuit 2. As a result of the negative slope of the phase-versus-frequency characteristic of the high-frequency amplifiers commonly employed, associated side-band frequencies of the high-frequency oscillations to be amplified are subject to oppositely-directed phase-shifts with respect to the carrier-wave frequency, causing a phase-shift of the same order of magnitude of the low-frequency control signals which are obtained by amplitude detection and correspond to the said side-band frequencies. In a practical embodiment of the circuit shown in Fig. 1 parasitic oscillation having a frequency of 9.1 kc./s. was found to occur in the AFC-loop when the compensating circuit 10 was omitted.

The parasitic oscillation was suppressed by the use of a compensating circuit 10 which is tuned to the same frequency as is the circuit 9. Compensating circuit 10 constitutes, together with a resistor 21, a voltage divider which is connected parallel to the circuit 9, the partial voltage set up across resistor 21 being supplied by way of coupling capacitor 11 to the control grid of pentode 12. The phase-shifts brought about by compensating circuit 10 in conjunction with resistor 21 for side-band frequencies of the voltage supplied to the pentode amplifier 12 are opposite to the phase-shifts brought about by the circuit 9. This results in at least partial compensation of the unwanted phase-shifts brought about by circuit 9.

Complete compensation of the unwanted phase-shifts brought about by circuit 9 may be obtained in the illustrated circuit comprising compensating circuit 10 by using a quality (Q) of this circuit which is higher than that of circuit 9. However, this results in the voltage divider comprising compensating circuit 10 and resistor 21 bringing about a material attenuation of the voltage which is set up across circuit 9 and to be supplied to pentode amplifier 12. In view thereof it is desirable that compensation of the unwanted phase-shifts should not be increased further than strictly necessary. In the practical embodiment shown, sufficient compensation is obtained by using the following values of the parts concerned.

| | | |
|---|---|---|
| Circuit 9: | | |
| Circuit coil | μH | 142 |
| Circuit capacity | μμf | 500 |
| Circuit quality Q | | 30 |
| Compensating circuit 10: | | |
| Circuit coil | μH | 142 |
| Circuit capacity | μμf | 500 |
| Circuit quality Q | | 20 |
| Resistor 21 | ohms | 7500 |
| Coupling capacitor 11 | μμf | 5000 |

The phase-shift brought about by circuit 9 at the said oscillation frequency of 9.1 kc./s. was reduced from 47° to 15° by the use of compensating circuit 10.

Figure 2:
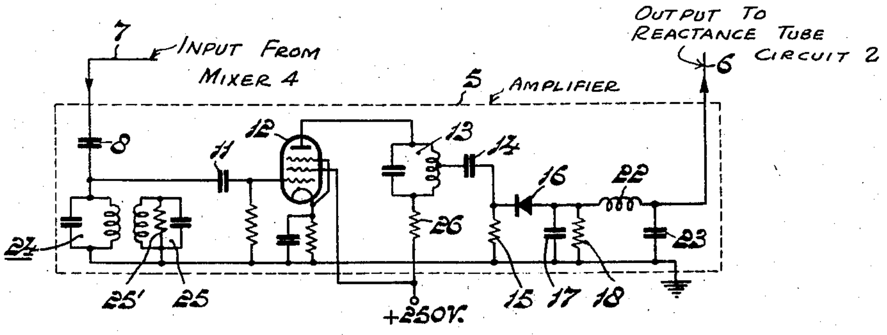
Fig. 2 shows a modification of a high-frequency amplifier comprising phase-compensating means for use in the control-voltage generator shown in Fig. 1.

Fig. 2 shows a modification of the amplifier stage 5 of the control-voltage generator shown in Fig. 1. Identical parts are indicated by the same reference numerals.

The parts 11 to 18 of Fig. 2 correspond to similar parts of Fig. 1. The low-pass output filter of the amplifier stage 5, in contradistinction with Fig. 1, comprises a series-coil 22 and a parallel capacitor 23, this especially in view of the suppression of frequencies corresponding to the tuning frequency of the preceding high-frequency amplifier.

The input circuit of the high-frequency amplifier comprises, as shown in Fig. 2, a band-pass filter comprising circuits 24 and 25 which are coupled about critically in the manner which is usual for band-pass filters. This coupling may in itself be inductive as shown, but it is alternatively possible to utilise a capacitive coupling or a mixed inductive-capacitive coupling.

In order to obtain compensation of unwanted phase-shifts of side-hand frequencies, the output voltage of the band-pass filter, in contradistinction with the usual practice, is derived from the primary band-pass filter circuit and hence from circuit 24. The alive extremity of circuit 24 is coupled by way of coupling capacitor 11 to the control grid of pentode 12, and the corresponding extremity of circuit 25 is not connected. The secondary circuit of the band-pass filter comprises a damping resistor 25′. When use is made of the described band-pass filter circuit, it is possible, as before, to bring about complete compensation or even over-compensation of unwanted phase-shifts of the side-band frequencies.

A further possibility of limiting unwanted phase-shifts by means of a tuning circuit is utilised in Fig. 2 in the output circuit of pentode 12, since the output impedance is constituted by the series-combination of anode circuit 13 and a resistor 26, the latter of which causes a decrease in the slope of the phase-versus-frequency characteristic for the total output impedance of tube 12 as compared with the position in the absence of resistor 26. It is to be noted that resistor 26 detrimentally affects the selectivity of the output impedance of amplifier 12, so that for this reason the compensating means discussed hereinbefore are preferable.

Figure 3:
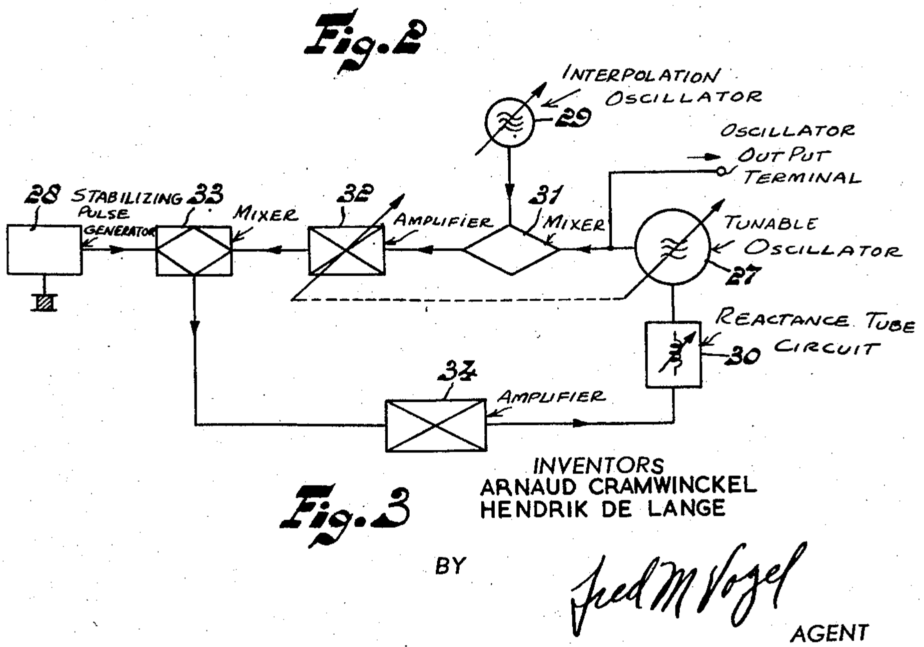
Fig. 3 shows the block diagram of a device according to the invention for automatic frequency-correction of a high-frequency oscillator with respect to stabilising pulses and an interpolation frequency derived from an interpolation oscillator.

Fig. 3 shows a block diagram of a device for automatic frequency correction of a high-frequency oscillator 27, to which the invention may also advantageously be applied. In Fig. 3, the high-frequency oscillator 27 is stabilised with respect to a high harmonic of stabilising pulses produced by a pulse generator 28, which harmonic may be chosen by initial tuning of the high-frequency oscillator, and a sinusoidal voltage of comparatively low frequency (interpolation oscillator) provided by a stable oscillator 29. The frequency produced by oscillator 29 may be adjustable, for example, in stages of 10 kcs./s. within a range of from 250 to 350 kcs./s.

In the device shown in Fig. 3, the AFC-voltage which is to be supplied to a reactance tube circuit 30 coupled to the high-frequency oscillator 27 is produced as follows. The output voltage of the high-frequency oscillater 27 is mixed in a mixing stage 31 with the output voltage of interpolation oscillator 29, the resultant difference frequency (or, if desired, the sum frequency) being amplified selectively in a high-frequency amplifier 32. The voltage of difference frequency derived from high-frequency amplifier 32 is supplied to a pulse mixing stage 33 which, normally, is cut off and is released during each pulse of stabilising-pulse generator 28. A further selective high-frequency amplifier 34 together with a subsequent detector is connected to the output of mixing stage 33 in a similar manner as the high-frequency amplifier 5 with the associated detector is coupled to pulse mixing stage 4 of Fig. 1. The detected output voltage of amplifier 34 is supplied as an AFC-voltage to the reactance tube circuit 30.

During operation of the described AFC-circuit, the frequency of high-frequency oscillator 27 is stabilised on a frequency equal to the sum of the frequency of the stabilising harmonic of the stabilising pulses (28) and the frequency of the interpolation oscillator 29. The stabilising harmonic of the stabilising pulses may be chosen by initial tuning of oscillator 27. When oscillator 27 is detuned, the high-frequency amplifier 32 must also be detuned, so that the tuning members of oscillator 27 and high-frequency amplifier 32 preferably are coupled mechanically. When the tunable high-frequency amplifier 32 is of the broad-band amplifier type (bandwidth about 100 kcs./s.) the high-frequency amplifier need not be detuned upon variation of the interpolation frequency provided by oscillator 29.

Unwanted phase-shifts of side-band frequencies which lead to instabilities of the AFC-circuit may occur in both the high-frequency amplifier 32 and the high-frequency amplifier 34, as discussed in connection with the high-frequency amplifier to Fig. 1. In order to suppress the said instabilities, the high-frequency amplifiers 32 and 34 may comprise means of compensating unwanted phase-shifts as explained in detail with reference to the circuits 9—10 and 24—25 in Figs. 1 and 2.

What is claimed is:

1. An automatic frequency control circuit for controlling the frequency of an oscillator, comprising a source of stabilizing signals, a signal mixing stage, means connected to feed said stabilizing signals and the oscillations from said oscillator into said mixing stage thereby to produce a control oscillation having side-band frequencies, a tuned amplifier circuit connected to amplify said control oscillation, a detector circuit connected to the output of said amplifier circuit to derive an automatic frequency control voltage from the amplified control oscillation, a frequency corrector device coupled to said oscillator, and means connected to feed said automatic frequency control voltage to said frequency corrector device, said tuned amplifier having the characteristic of imparting to said control oscillation oppositely-directed phase shifts of said side-band frequencies, and compensating means coupled in said amplifier circuit for causing phase shifts of said side-band frequencies which are opposite to the phase shifts caused by said tuned amplifier, thereby increasing the stability of said automatic frequency control circuit.

2. A circuit as claimed in claim 1, in which said amplifier circuit comprises a parallel-resonant circuit tuned to the frequency of said control oscillation and connected to receive said control oscillation, said parallel-resonant circuit having the characteristic of imparting said oppositely-directed phase shifts to said side-band frequencies, and in which said compensating means comprises a resonant circuit connected to receive said control oscillation and tuned to the same frequency to which said parallel-resonant circuit is tuned.

3. A circuit as claimed in claim 2, in which said compensating resonant circuit comprises the combination of a parallel-resonant circuit connected in series with a resistor, said combination being connected in parallel with the first-named said parallel-resonant circuit, input means connected to feed said control oscillation to said first-named parallel-resonant circuit, and output means connected to derive said control oscillation from the junction of said series-connected resistor and the parallel-resonant circuit of said combination.

4. A circuit as claimed in claim 2, in which said compensating resonant circuit comprises a tuned secondary circuit coupled electrically to said parallel-resonant circuit, and including input means connected to feed said control oscillation to said parallel-resonant circuit, and output means connected to derive said control oscillation from said parallel-resonant circuit.

References Cited in the file of this patent

UNITED STATES PATENTS

| | | |
|---|---|---|
| 2,404,809 | O'Brien | July 30, 1946 |
| 2,473,790 | Crosby | June 21, 1949 |